United States Patent
Bresser

(10) Patent No.: US 12,372,566 B2
(45) Date of Patent: Jul. 29, 2025

(54) METHOD, SYSTEM AND PROBE FOR MEASURING AND VISUALIZING VALUES OF AN ELECTROMAGNETIC PARAMETER OF A PCB

(71) Applicant: Rohde & Schwarz GmbH & Co. KG, Munich (DE)

(72) Inventor: Gerd Bresser, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 208 days.

(21) Appl. No.: 18/185,156

(22) Filed: Mar. 16, 2023

(65) Prior Publication Data
US 2023/0417821 A1  Dec. 28, 2023

(30) Foreign Application Priority Data

Jun. 22, 2022 (EP) .................................... 22180429

(51) Int. Cl.
| | |
|---|---|
| G01R 31/00 | (2006.01) |
| G01R 13/40 | (2006.01) |
| G01R 31/28 | (2006.01) |

(52) U.S. Cl.
CPC ......... *G01R 31/002* (2013.01); *G01R 13/408* (2013.01); *G01R 31/2806* (2013.01)

(58) Field of Classification Search
CPC ...... G01R 31/002; G01R 1/025; G01R 13/02; G01R 13/408; G01R 31/2806; G01R 1/07; G01N 21/84
See application file for complete search history.

(56) References Cited

U.S. PATENT DOCUMENTS

| | | | |
|---|---|---|---|
| 9,063,180 B2 * | 6/2015 | Yagitani | G01R 29/0871 |
| 2002/0095304 A1 * | 7/2002 | Khazei | G01R 31/002 |
| | | | 702/127 |
| 2013/0006570 A1 | 1/2013 | Kaplan | |

FOREIGN PATENT DOCUMENTS

| | | | |
|---|---|---|---|
| EP | 1 203 962 A2 | 5/2002 | |
| EP | 1 203 962 A3 | 1/2003 | |

(Continued)

OTHER PUBLICATIONS

Deutschmann, Bernd et al.; "Highlighting the distribution path of transient disturbances by near field scanning techniques"; Elektrotechnik und Informationstechnik, Springer Verlag Wien; Jan. 28, 2016, vol. 133, No. 1, pp. 18-24, XP035884592, ISSN: 0932-383X, DOI: 10.1007/s00502-015-0382-6 [retrieved on Jan. 28, 2016].

(Continued)

*Primary Examiner* — Amy He
(74) *Attorney, Agent, or Firm* — Studebaker Brackett PLLC

(57) ABSTRACT

Method, system and probe for visualizing measured values of an electromagnetic parameter of a PCB. A probe head of a probe contactless measures values of at least one electromagnetic parameter at at least two different positions of the PCB, a camera fixed in position relative to the probe head records for each of the different positions an image of an area of the PCB around the probe head, for each of the different positions, the measured value of the electromagnetic parameter is correlated with the recorded image of the area of the PCB around the probe head, a location of each of the recorded images of the areas on a map representation of the PCB is determined, the map representation of the PCB with the measured values of the electromagnetic parameter, (Continued)

and the map representation of the PCB is visualized together with the superimposed measured values of the electromagnetic parameter.

15 Claims, 5 Drawing Sheets

(56) References Cited

FOREIGN PATENT DOCUMENTS

WO    2008/056874 A1    5/2008
WO    2014/024468 A1    2/2014

OTHER PUBLICATIONS

Extended European Search Report issued in EP 22180429.7-1001 by the European Patent Office on Dec. 15, 2022.

* cited by examiner

METHOD, SYSTEM AND PROBE FOR MEASURING AND VISUALIZING VALUES OF AN ELECTROMAGNETIC PARAMETER OF A PCB

The present invention is related to a method, system and probe for visualizing measured values of an electromagnetic parameter of a printed circuit board (PCB), wherein a probe head of the probe contactless measures values of at least one electromagnetic parameter at at least two different positions of the PCB and a camera fixed in position relative to the probe head records for each of the different positions an image of an area of the PCB around the probe head.

A probe, in particular an oscilloscope probe, is a device used to connect a signal source, for example a measuring point in an electronic circuit for measuring a signal of the electronic circuit, to an oscilloscope. In particular, the probe has a physical connection to the oscilloscope making an electrical connection. Depending on the signal source and the measurement to make, a probe can be as simple as a wire (e.g. a passive probe) or as sophisticated as an active differential probe, which includes an amplifier to keep the probe input capacitance very low to minimize the influence of the probe on the signal to measure.

Different oscilloscope probes exist for a variety of applications like debugging of complex electronic circuits, signal integrity measurements of high-speed serial bus signals, as well as characterization of power electronics with high voltage levels.

Further, it should be noted that because of the miniaturization of the electronic circuits it becomes more and more difficult to exactly place respectively position a probe head or probe tip of the probe on the desired measuring point for measuring a signal. In view of this problem, the European patent application EP 3 686 610 A1 describes a probe, measuring system and method for applying a probe, wherein an image capturing device such as a camera is firmly arranged at the probe. The image capturing device captures image data around an area of the probe tip, and the captured image data is then provided to an user during positioning the probe tip at the desired measuring point. Therefore, a user can have a detailed view of the area around the probe tip and the positioning of the probe tip is simplified.

The above described electronic circuits are mainly positioned on a PCB.

It should be further noted that the probes cannot only be connected to an oscilloscope, but also to an spectrum analyzer, signal analyzer or an electromagnetic interferences, EMI, test receiver.

In difference to the probes that have a direct contact to the electronic circuit, further, so called near-field probes, exist, which have no direct contact to the electronic circuit and measures parameters based on a touchless or contactless measurement method.

Near-field probes are used to analyze electromagnetic compatibility, EMC, problems in electronic circuits and to identify their causes (for example EMI). There exist several near-field probe sets that include E-field and H-field probes for the use with oscilloscopes, signal and spectrum analyzers and EMI test receivers.

Near-field measurements are often performed if, for example, a developer has to find out why an emission limit of an EMC standard is exceeded. Based on field strength measurements, the developer already knows several critical frequencies of the device or module under test. A practical way to reduce EMI is to analyze near fields, locate the sources and come up with targeted countermeasures. Furthermore, the passive near-field probes can also be used for immunity measurements.

By these near-field probes, it is possible to measure an particular parameter, for example an EMI or EMC parameter at a desired measurement point, respectively position, and show or display a value of the parameter on for example an oscilloscope at this particular position.

However, to clearly determine for example for a PCB in which areas of the PCB EMIs are high and where the EMI sources exactly exist, it is necessary to have values of different positions respectively areas of the PCB of the EMC respectively EMI parameter. Thus, measurements with the probe has to be done at several positions of the PCB and each value has to be saved or noted down to have for each position a corresponding value of the parameter. At the end of the measurements, a user has then to compare manually the values with each other and check at which positions the highest values exist. This procedure is quite complicated for a user.

It is therefore an object of the present invention to simplify the location of EMI sources on a PCB.

This object is achieved by means of the features of the independent claims. The dependent claims further develop the central idea of the present invention.

The present invention relates to a method for visualizing measured values of an electromagnetic parameter of a PCB, wherein a probe head of a probe contactless measures values of at least one electromagnetic parameter at at least two different positions of the PCB, and a camera fixed in position relative to the probe head records for each of the different positions an image of an area of the PCB around the probe head. For each of the different positions, the measured value of the electromagnetic parameter is then correlated with the recorded image of the area of the PCB around the probe head and a location of each of the recorded images of the areas is determined on a map representation of the PCB. Further, the map representation of the PCB is superimposed with the measured values of the electromagnetic parameter and the map representation of the PCB is visualized together with the superimposed measured values of the electromagnetic parameter.

Advantageously, the electromagnetic parameter can be an electromagnetic compatibility, EMC, parameter or an electromagnetic interference, EMI, parameter.

In a preferred embodiment, the map representation of the PCB is available at the beginning of the method, wherein each of the recorded images of the areas is compared with the map representation of the PCB and the location of each of the recorded images of the areas is determined on the map representation of the PCB based on the comparisons. The map representation of the PCB can be a graphical map representation of the PCB, in particular a photo or an image of the PCB, and the graphical map representation of the PCB is prerecorded or recorded at the beginning of the method. It would be also possible that the map representation of the PCB is a pre-available layout of the PCB and an image of the PCB is generated by using the recorded images of the areas.

In another preferred embodiment, the map representation of the PCB is not available at the beginning of the method, wherein after the correlation and before the determination, the map representation of the PCB is generated by using the recorded images of the areas. In this case, the location of each of the recorded images of the areas can be determined on the map representation of the PCB based on the previous generation.

Advantageously, the superimposed measured values of the electromagnetic parameter can be visualized on the map representation of the PCB by using a 2-dimensional, 2.5-dimensional or 3-dimensional technique, wherein the superimposed measured values of the electromagnetic parameter can be overlaid with false color on the map representation of the PCB, the map representation of the PCB can be false color coded based on the superimposed measured values of the electromagnetic parameter to visualize them, or bar graphs can be used to visualize the superimposed measured values of the electromagnetic parameter on the map representation of the PCB.

The present invention further relates to a system for visualizing measured values of an electromagnetic parameter of a PCB, where the system comprises a probe with a probe head for contactless measuring values of at least one electromagnetic parameter at at least two different positions of the PCB, and a camera fixed in position relative to the probe head and for recording for each of the different positions an image of an area of the PCB around the probe head. Further, the system comprises a processing device for correlating, for each of the different positions, the measured values of the electromagnetic parameter with the recorded image of the area of the PCB around the probe head, for determining a location of each of the recorded images of the areas on an map representation of the PCB, and for superimposing the map representation of the PCB with the measured values of the electromagnetic parameter. In addition, the system comprises a visualization device for visualizing the map representation of the PCB together with the superimposed measured values of the electromagnetic parameter.

Advantageously, the camera can be arranged in the probe, in particular in the probe head, or close to the probe, and the probe can comprise a button or micro button for triggering the camera to record the images of the areas.

Further, it is possible that the system additionally can comprise an oscilloscope, spectrum analyzer, signal analyzer or EMI test receiver, wherein the processing device and the visualization device can be arranged in the oscilloscope, spectrum analyzer, signal analyzer or EMI test receiver and the probe and the camera are connected with the oscilloscope, spectrum analyzer, signal analyzer or EMI test receiver.

The present invention further relates to a probe for measuring values of an electromagnetic parameter of a PCB, wherein the probe comprise a probe head for contactless measuring values of at least one electromagnetic parameter at at least two different positions of the PCB and a camera for recording for each of the different positions an image of an area of the PCB around the probe head. Further, the probe comprises a processing unit for correlating, for each of the different positions, the measured values of the electromagnetic parameter with the recorded image of the area of the PCB around the probe head, for determining a location of each of the recorded images of the areas on an map representation of the PCB, and for superimposing the map representation of the PCB with the measured values of the electromagnetic parameter. In addition, the probe comprises a transmission unit for transmitting the map representation of the PCB together with the superimposed measured values of the electromagnetic parameter to a visualization device.

Advantageously, the transmission unit can be configured to transmit the map representation of the PCB together with the superimposed measured values of the electromagnetic parameter to an oscilloscope, spectrum analyzer, signal analyzer or EMI test receiver.

By measuring values at different positions, recording an image of the corresponding position and correlating the measured value with the corresponding image, it is possible to find a location of the corresponding image on the PCB and relate this location with the corresponding measured value. With this relation it is then possible to show a corresponding map representation of the whole PCB together with all the measured values and therefore give a user a detailed information where EMI sources are existing and in which areas the EMI is in particular high.

These and other aspects and advantages of the present invention will become more apparent when studying the following detailed description, in connection with the figures in which.

As already described above, near-field probes are used to analyze EMC problems in electronic circuits and to identify their sources. Therefore, electromagnetic parameters of an electronic circuit on a PCB are measured to find out why an emission limit of an EMC standard is exceeded. To reduce EMI the near fields are analyzed and sources of EMI are located to come up with targeted counter measures.

Until now a user has to save or note down a measured value of the electromagnetic parameter at each position of the PCB and then has to manually compare and check where the highest values and therefore the highest EMI is measured, which is quite complicated and needs a lot of time and work.

In difference thereto in the present invention a method, system and probe are provided for visualizing measured values of an electromagnetic parameter of a PCB, wherein values of the electromagnetic parameter are contactless measured at different positions of the PCB and at each position an image of an area around the probe head is recorded by a camera. The measured value and the image of each position are correlated and a location of the image on the PCB is determined. Based on this location, the map representation of the PCB is superimposed with the measured values of the electromagnetic parameter and then the map representation with the superimposed measured values of the EMC parameter is visualized.

Figure 1:
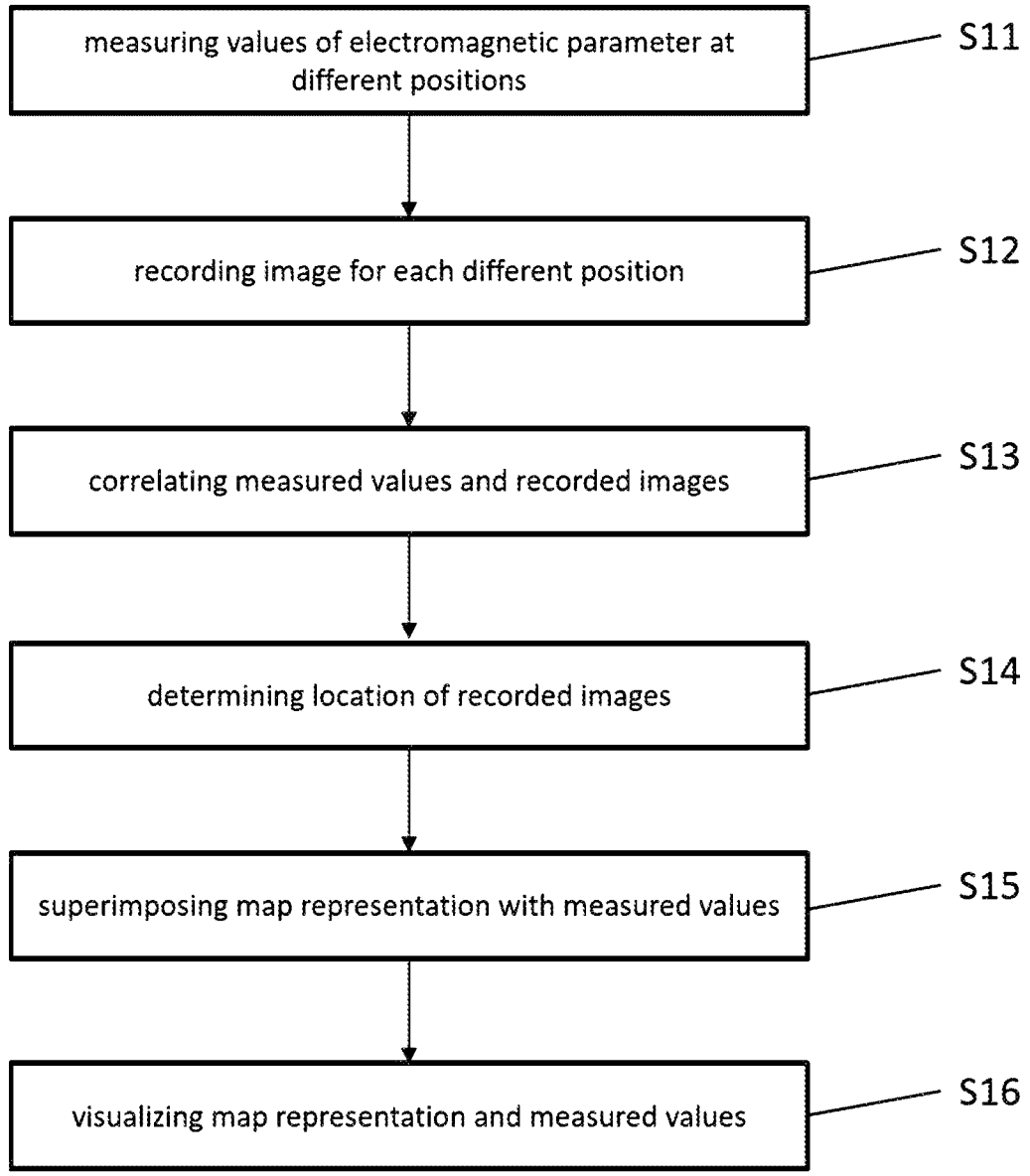
FIG. 1 shows a flow diagram of a method according to an embodiment of the present invention.

FIG. 1 shows a block diagram of a method for visualizing measured values of an electromagnetic parameter of a PCB. In step S11 a probe head of a probe contactless measures values of at least one electromagnetic parameter at at least two different positions of the PCB. Therefore, at least two values, preferably several values, of an electromagnetic parameter, for example an EMC or EMI parameter, are derived by the contactless measuring by using the probe with the probe head.

In addition, the method then further comprises step S12, wherein in the step a camera that is fixed in position relative to the probe head records for each of the different positions an image of an area of the PCB around the probe head. That the camera is fixed in position relative to the probe head means that when the probe with the probe head is moved to another position respectively area on the PCB, the camera is also moved in a similar way so that afterwards the camera can record the area of the PCB around the probe head at the new position. This is for example possible in case the camera is arranged in the probe, in particular in the probe head, at the probe or the camera is arranged close to the probe by a fixed connection to the probe and thus, when moving the probe the camera is moved together with the probe in a similar way.

In step S12 for each different position an image of an area of the PCB around the probe head is recorded.

Alternatively, it would be possible that the camera records or outputs video streams (comprising several images) at each position and then, for the further steps of the method, the video streams of the areas are used instead of the images of the areas. By only recording one image at each position, the data transfer amount will be significantly reduced.

By measuring a value of an electromagnetic parameter and an image at each different position of the PCB, there are several values and images and for each position there is a value and an image.

In step S13, the method therefore further comprises that for each of the different positions the measured value of the electromagnetic parameter is correlated with the recorded image of the area of the PCB around the probe head.

After this correlation it is then possible that in step S14 a location of each of the recorded images of the areas on a map representation of the PCB is determined and in step S15 the map representation of the PCB is superimposed with the measured values of the electromagnetic parameter. That means that by using the recorded image of each area and therefore for each position where a measurement has been done, the corresponding location on a PCB can be determined and then, by knowing the exact location, the map representation can be superimposed with the measured values.

The step of superimposing the map representation of the PCB with the measured values of the electromagnetic parameter in step S15 means for example that, based on the knowledge of the location of the measurement on the map representation of the PCB, each measured value of the electromagnetic parameter can be assigned respectively allocated respectively attached to the location on the map representation of the PCB.

In step S16 the map representation of the PCB is then visualized together with the superimposed measured values of the electromagnetic parameter.

The visualization in the step S16 means that the map representation of the PCB is displayed together with the measured values of the electromagnetic parameter based on a 2-dimensional, 2.5-dimensional or 3-dimensional technique, for example the electromagnetic parameter are overlaid with false color on the map representation of the PCB, the map representation of the PCB is false color coded based on the superimposed measured values of the electromagnetic parameter to visualize them, or bar graphs are used to visualize the superimposed measured values of the electromagnetic parameter on the map representation of the PCB. These overlaid technologies between maps respectively map representations and values already exist and therefore are not described in detail here.

Only as examples, it is referred to a map of a country on which different values of a temperature parameter are overlaid as known for example from several weather apps.

Another option would be for example a 3-dimensional view of the PCB to coat different parts (hardware components) of the PCB in different colors depending on the measured values of the electromagnetic parameter.

Further, it would be possible to show the different values, which are distributed over the PCB by using bar graphs having different heights on a 3-dimensional map representation of the PCB to show the measured values. Additionally it would be possible to overlay the map representation of the PCB with false colors to show the different measured values.

As already described before, the probe with the probe head is connected to an oscilloscope, a spectrum analyzer, a signal analyzer or a EMI test receiver. Thus, it would be possible to visualize the map representation of the PCB together with the superimposed measured values of the electromagnetic parameter on a display of the oscilloscope, the spectrum analyzer, the signal analyzer or the EMI test receiver. This can be done in addition to any displaying of measurement values or by replacing such displayed measurement values.

Alternatively, it would be also possible that an attached separate additional display is used.

Showing the resulting overlaid map representation of the PCB will give a user a most helpful overview about where critical sections in an electronic circuit are located and further an easy documentation is possible for example via a screenshot.

Figure 2:
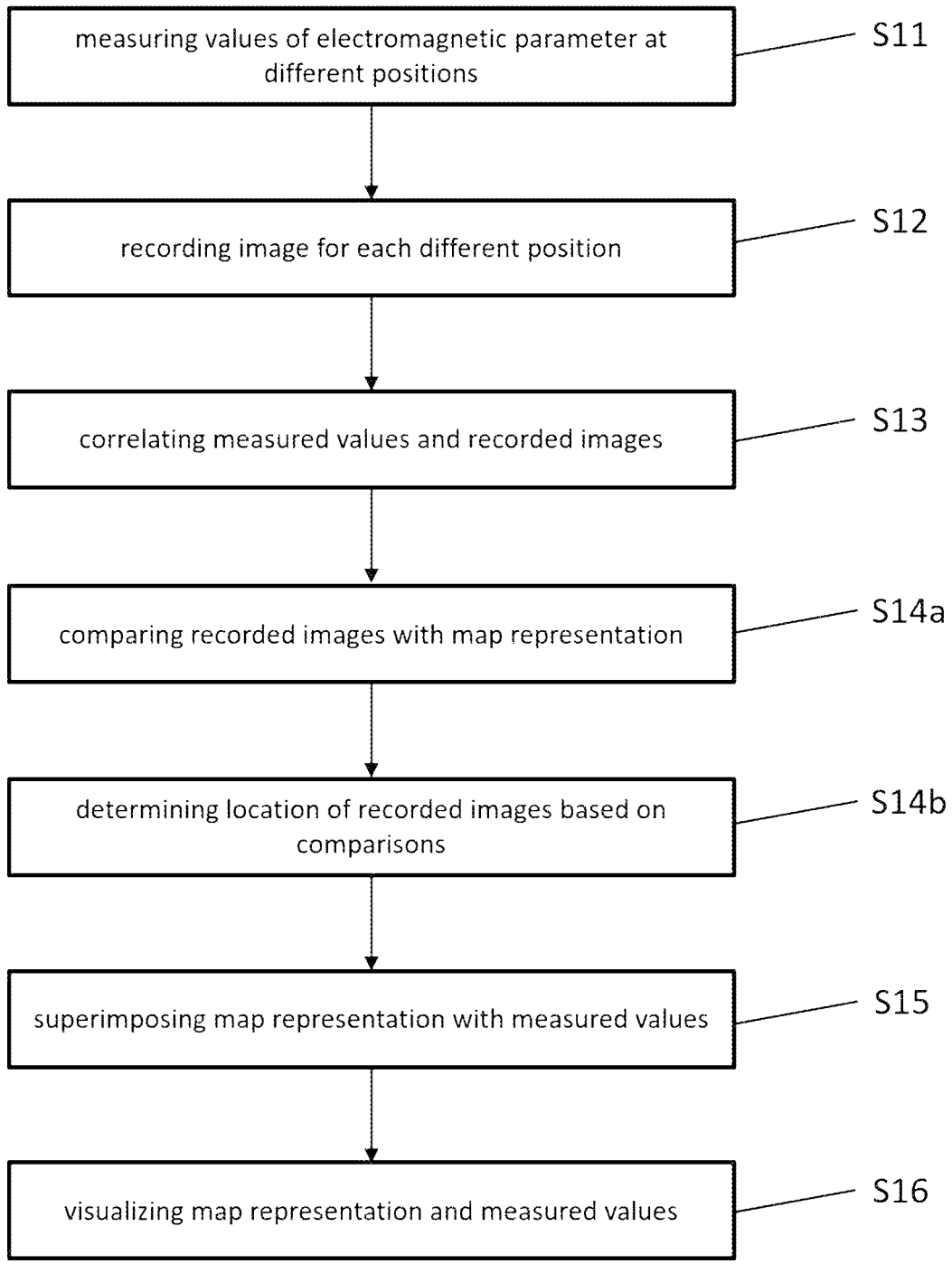
FIG. 2 shows a flow diagram of a method according to an embodiment of the present invention.

FIG. 2 shows a further block diagram of a method for visualizing measured values of an electromagnetic parameter of a PCB, wherein the determining step S14 of FIG. 1 is described in more detail in FIG. 2 in the steps S14a and S14b. The steps S11, S12, S13, S15 and S16 are similar to the steps S11, S12, S13, S15 and S16 of FIG. 1.

Further, in the method shown in FIG. 2, the map representation of the PCB is available at the beginning of the method, wherein the map representation of the PCB is a graphical map representation of the PCB, in particular a photo or an image of the PCB, and the graphical map representation of the PCB is for example prerecorded or recorded at the beginning of the method, wherein the recording at the beginning of the method can be done by any camera. That means, that before the step S11 is performed, already a map representation of the PCB for example a photo or an image exists.

This already pre-available map representation of the PCB is then used in the steps S14a and S14b, wherein in step S14a each of the recorded images of the areas is compared with the map representation of the PCB and in step S14b the location of each of the recorded images of the areas on the map representation of the PCB is determined based on the comparisons of the step S14a.

For the steps S14a and S14b intelligent bitmap processing algorithms are used to compare for each of the different positions the corresponding image of the area of the PCB around the probe head with the map representation of the PCB and to determine the location of each of the recorded images of the areas on the map representation of the PCB. Since such algorithms already exist, they are not described in detail here.

Instead of a photo or an image as a map representation or a graphical map representation of the PCB, it would be also possible in the method of FIG. 2 that the map representation is a pre-available layout of the PCB and the pre-available layout of the PCB is superimposed with the measured values. In case the pre-available layout of the PCB is used at the beginning as the map representation of the PCB and it is desired to have a photo or an image to visualize the superimposed measured values, it would be possible that a photo or an image of the PCB is generated respectively created based on the images of the areas recorded in step S12. Therefore, even so only a layout of the PCB is pre-available at the beginning of the method, it is still possible to visualize in step S16 a photo or an image of the PCB together with the superimposed measured values of the electromagnetic parameter.

Figure 3:
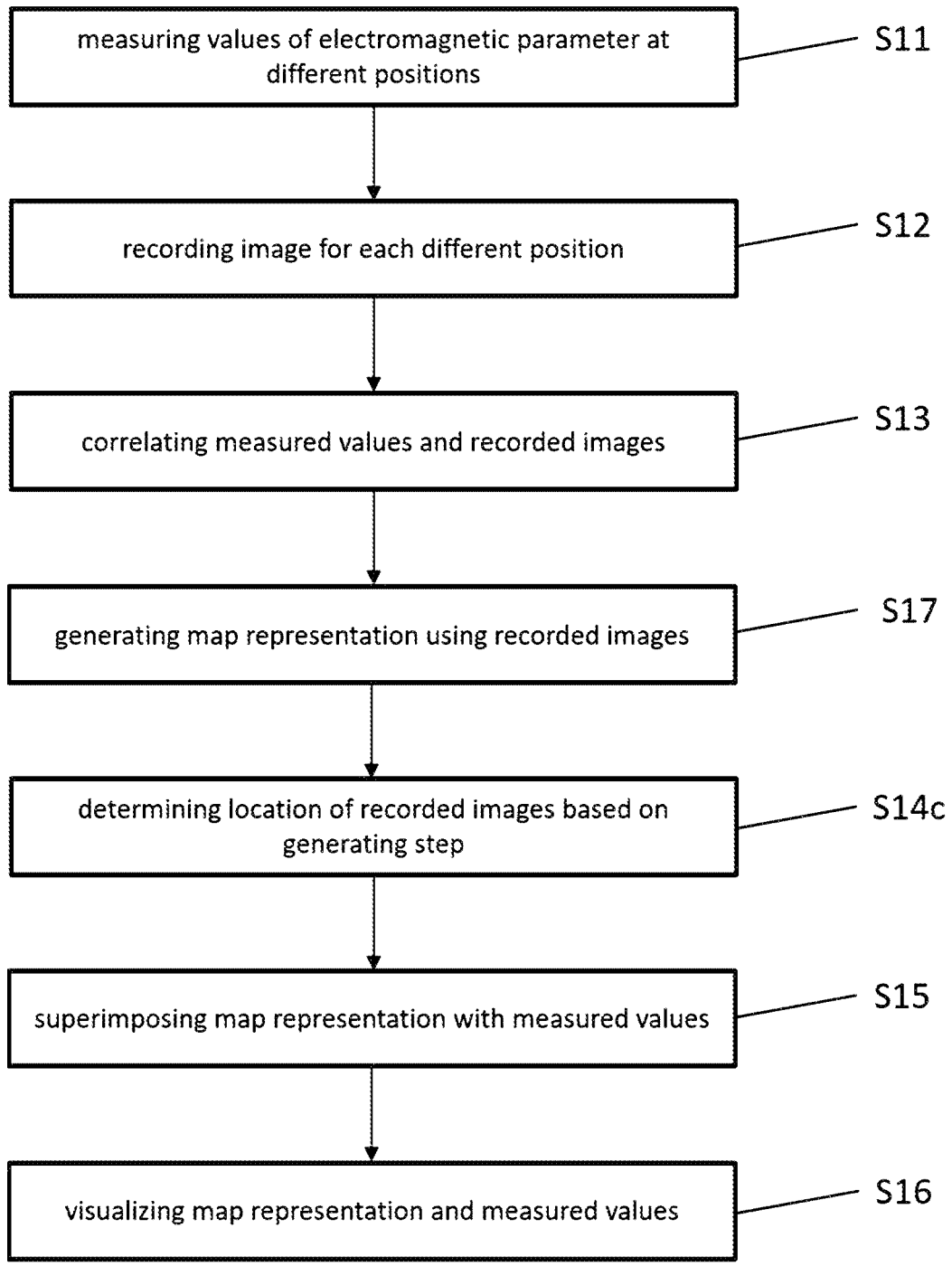
FIG. 3 shows a flow diagram of a method according to an embodiment of the present invention.

FIG. 3 further describes a method for visualizing measured values of an electromagnetic parameter of a PCB, wherein the method in FIG. 3 is in particular used in case no map representation of the PCB is available at the beginning of the method. Again, similar as in FIG. 2, the steps S11, S12, S13, S15 and S16 correspond to the steps S11, S12, S13, S15 and S16 of the method in FIG. 1.

In difference to FIG. 2, where the map representation of the PCB is already available at the beginning of the method, in FIG. 3 after the correlating step S13, there is a further step S17, in which a map representation is generated respectively created respectively constructed by using the recorded images of the areas. To generate such a map representation of the PCB, it is preferable that the recorded images of the areas of the PCB cover the whole PCB so that by joining respectively assembling respectively connecting the separate recorded images of each area of the PCB a complete image of the PCB can be generated as a map representation of the PCB. Techniques for such a generation of a map representation by using different single images are already known, only for example it is referred to the technique for making panorama pictures by using several single pictures (photo-stitcher technique).

Additionally it should be noted that preferably in the steps S11 and S12, in which the values are measured and the images of areas are recorded, the different positions are chosen in a particular order, which is saved, so that it is clear in step S17, which images have to be connected with each other. As an example, when a PCB has a square form, the first position is in the left upper corner and then starting from this corner, the next positions are chosen along the left sideline of the square to the left lower corner, then the next position is chose by shifting right. After that the next positions are chosen from the lower sideline up to the upper sideline and at the upper sideline the position is shifted right. This procedure is done based on the size of the area for the whole square so that each area of the PCB is covered in a corresponding order.

The different positions for the steps S11 and S12 can be chosen in the methods shown in the FIGS. 1, 2 and 3 by a particular order as described above, wherein in the method in the FIG. 1 and also in the method in FIG. 2, it would be additionally possible that the positions are chosen randomly without a particular order. In case of a random positioning of the probe and the probe head in the steps S11 and S12, it preferably should be made sure that each area of the PCB is covered by the probe.

In the method in FIG. 3 the determining step S14 of the method in FIG. 1 is further detailed in that in step S14c the location of each of the recorded images of the areas on the map representation of the PCB is determined based on the generating step S17. Since in step S17 each of the recorded images of the areas is joined together to the map representation of the PCB, it is known where each recorded image is placed on the map representation of the PCB. This information is stored and then used in step S14c for determining the location. In this case, it is not necessary anymore that an intelligent bitmap processing algorithm has to be used to compare the recorded images of the areas with the map representation of the PCB to find each location of each recorded image.

Figure 4:
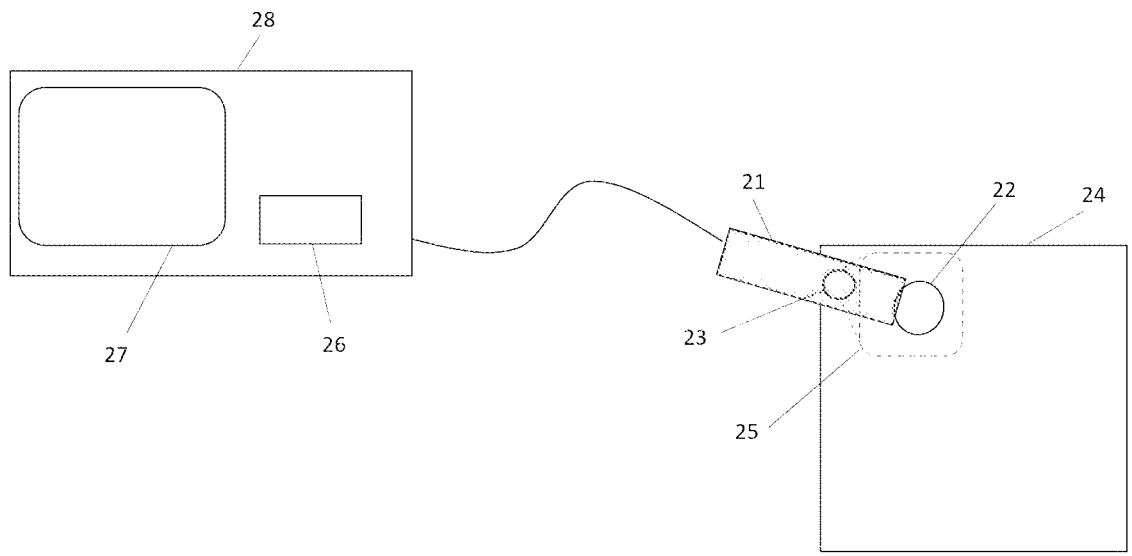
FIG. 4 shows schematically a system for visualizing measured values of an electromagnetic parameter of a PCB according to an embodiment of the present invention.

FIG. 4 shows schematically a system for visualizing measured values of an electromagnetic parameter of a PCB, wherein the system comprises a probe 21, with a probe head 22 to contactless measure values of at least one electromagnetic parameter at at least two different positions of the PCB 24. The system further comprises a camera 23 fixed in position relative to the probe head 22 to record for each of the different positions an image of an area 25 of the PCB 24 around the probe head 22. As can be seen from FIG. 4, the camera 23 is fixed at the probe 21 respectively the probe head 22. It can be also integrated in the probe 21 or the probe head 22.

It is only relevant that the camera 23 can record an image of an area 25 of the PCB which is around the probe head 22. By placing the camera 23 at the probe 21 or the probe head 22 or in the probe 21 or in the probe head 22, it is further guaranteed that in case the probe head 22 respectively the probe 21 is moved from one position to another, the camera 23 is moved in a similar way, so that always the corresponding area 25 of the PCB 24 around the probe head 22 is recorded.

Further, the system comprises a processing device 26 and a visualization device 27, wherein the processing device 26 correlates for each of the different positions the measured values of the electromagnetic parameter with the recorded image of the area 25 of the PCB 24 around the probe head 22, determines a location of each of the recorded images of the areas 25 on a map representation of the PCB 24 and superimposes the map representation of the PCB 24 with the measured values of the electromagnetic parameter. The visualization device 27 visualizes the map representation of the PCB 24 together with the superimposed measured values of the electromagnetic parameter.

The processing device 26 and the visualization device 27 can be placed for example in an oscilloscope 28, a spectrum analyzer, a signal analyzer or an EMI test receiver and the probe 21 and the camera 23 are electrically connected with the oscilloscope 28, the spectrum analyzer, the signal analyzer or the EMI test receiver. In particular, in the system in FIG. 4, since the camera 23 is placed at respectively in the probe 21, the probe 21 is connected with the oscilloscope 28 and by this connection also the camera 23 is connected to the oscilloscope 28.

Further, the probe can comprise a button or a micro button for triggering the camera to record the images of the areas. By such a button or micro button, it is possible that a user, when newly positioning the probe, can trigger the recording of the image. Further, it would be possible that by this button not only the recording of the image is triggered, but also the measuring of the value on the corresponding position. Therefore, by pressing only once the button or the micro button, the recording of the image and also the measuring of the values is triggered.

Figure 5:
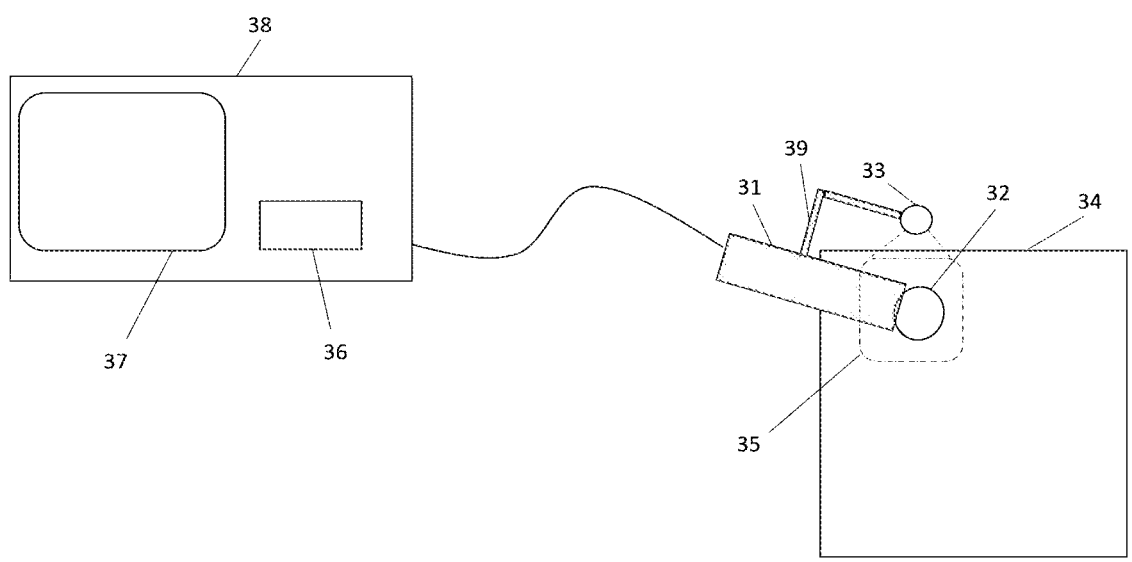
FIG. 5 shows schematically a system for visualizing measured values of an electromagnetic parameter of a PCB according to an embodiment of the present invention.

In FIG. 5 a further system for visualizing measured values of an electromagnetic parameter of a PCB is shown, wherein in FIG. 5 also an oscilloscope 38 with a visualization device 37 and a processing device 36 is shown. Further, the system also comprises a probe 31 with a probe head 32 and a camera 33.

In difference to the system in FIG. 4, however, the camera 33 is not positioned directly at the probe 31 or the probe head 32 or inside the probe 31 or the probe head 32. Instead, the camera 33 is arranged somewhere around respectively close to the probe 31 and probe head 32 (but not directly at the probe 31 or the probe head 32) so that the camera 33 can record an area 35 of an PCB 34 around the probe head 32. To make sure that the position of the camera 33 is fixed relative to the probe head 32, the camera 33 is fixed to the probe 31 or the probe head 32 by a rigid connection 39. By this rigid connection 39, it is again guaranteed that the camera 33 is moved in a similar way as the probe 31 respectively the probe head 32 and therefore always the area 35 of the PCB 34 around the probe head 32 can be recorded.

The processing device 36 and the visualization device 37 in the oscilloscope 38 in FIG. 5 have similar functions as the processing device 26 and the visualization device 27 in FIG. 4.

Regarding the visualization devices 27 and 37, it should be noted that in the FIGS. 4 and 5 it is shown that the visualization devices 27 and 37 are placed in the oscilloscopes 28 and 38. It would be, however, also possible that a separate visualization device is used to visualize the map representation of the PCB together with the superimposed measured values of the electromagnetic parameter.

Figure 6:
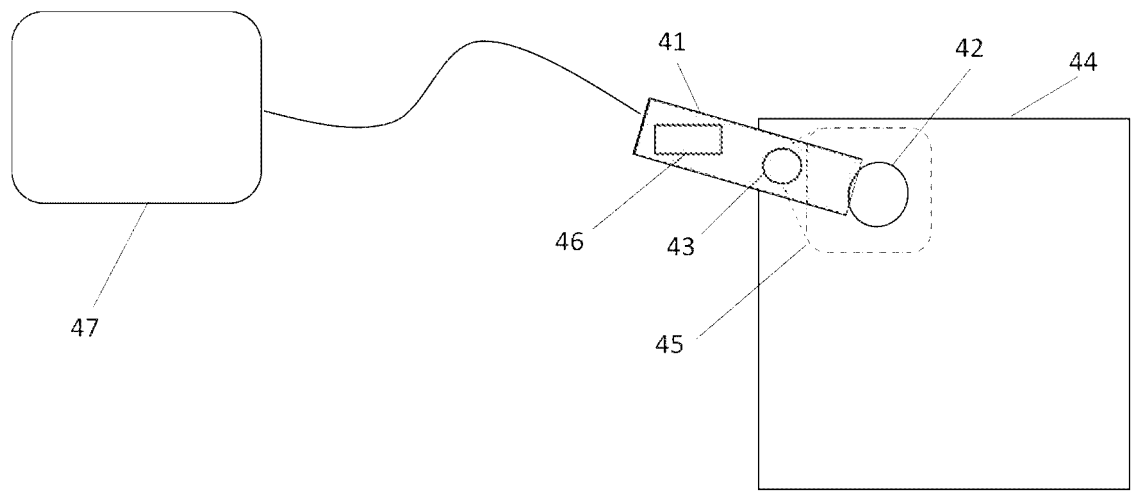
FIG. 6 shows schematically a probe for measuring values of an electromagnetic parameter of a PCB according to an embodiment of the present invention.

FIG. 6 shows a probe 41 for measuring values of an electromagnetic parameter of a PCB 44 that comprises a probe head 42 to contactless measure values of at least one electromagnetic parameter at at least two different positions of the PCB 44, a camera 43 to record for each of the different positions an image of an area 45 of the PCB 44 around the probe head 42, a processing unit 46 for correlating for each of the different positions the measured values of the electromagnetic parameter with recorded image of the area 45 of the PCB 44 around the probe head 42, determining a location of each of the recorded images of the areas 45 on a map representation of the PCB 44 and superimposing the map representation of the PCB 44 with the measured values of the electromagnetic parameter. Further, the probe 41 also comprises a transmission unit (not explicitly shown in FIG. 6) to transmit the map representation of the PCB 44 together with the superimposed measured values of the electromagnetic parameter to a visualization device 47.

The visualization device in FIG. 6 can be also placed in an oscilloscope similar to the FIGS. 4 and 5 or a spectrum analyzer, signal analyzer or EMI test receiver and the transmission unit transmits the map representation of the PCB together with a superimposed measured values of the electromagnetic parameter to the oscilloscope, the spectrum analyzer, the signal analyzer or the EMI test receiver.

Regarding the positioning and arrangement of the camera 43 in or at the probe 41 or the probe head 42, it is referred also to the system shown in FIG. 4, where the camera 23 is also positioned in or at the probe 21 respectively the probe head 22.

Similar as in the FIGS. 4 and 5, also in FIG. 6 it would be possible that the visualization device is an extra device separated from an oscilloscope and the visualization device is connected to the probe for transmitting the map representation of the PCB to the visualization device.

Further, the methods of the FIGS. 1, 2 and 3 can be performed by each of the systems of the FIGS. 4 and 5 and also the probe of the FIG. 6.

By the present invention, a map representation of a PCB can be displayed or visualized, wherein measured values of an electromagnetic parameter can be overlaid over the map representation so that a user has an overview where critical sections regarding EMC and EMI in an electronic circuit on a PCB are located.

The invention claimed is:

1. A method for visualizing measured values of an electromagnetic parameter of a printed circuit board, PCB, comprising:
   contactless measuring, by a probe head of a probe, values of at least one electromagnetic parameter at at least two different positions of the PCB;
   recording, by a camera fixed in position relative to the probe head, for each of the different positions an image of an area of the PCB around the probe head;
   correlating, for each of the different positions, the measured value of the electromagnetic parameter with the recorded image of the area of the PCB around the probe head;
   determining a location of each of the recorded images of the areas on a map representation of the PCB;
   superimposing the map representation of the PCB with the measured values of the electromagnetic parameter;
   visualizing the map representation of the PCB together with the superimposed measured values of the electromagnetic parameter.

2. The method of claim 1,
   wherein the electromagnetic parameter is an electromagnetic compatibility, EMC, parameter or an electromagnetic interference, EMI, parameter.

3. The method of claim 1,
   wherein the map representation of the PCB is available at the beginning of the method and the determining step further comprises:
   comparing each of the recorded images of the areas with the map representation of the PCB;
   determining, based on the comparisons, the location of each of the recorded images of the areas on the map representation of the PCB.

4. The method of claim 3,
   wherein the map representation of the PCB is a graphical map representation of the PCB, in particular a photo or an image of the PCB, and the graphical map representation of the PCB is prerecorded or recorded at the beginning of the method.

5. The method of claim 3,
   wherein the map representation of the PCB is a pre-available layout of the PCB and the method further comprises:
   generating an image of the PCB by using the recorded images of the areas.

6. The method of claim 1,
   wherein the map representation of the PCB is not available at the beginning of the method and the method further comprises after the correlating step and before the determining step:
   generating the map representation of the PCB by using the recorded images of the areas.

7. The method of claim 6,
   wherein the determining step further comprises:
   determining, based on the generating step, the location of each of the recorded images of the areas on the map representation of the PCB.

8. The method of claim 1,
   wherein in the visualizing step the superimposed measured values of the electromagnetic parameter are visualized on the map representation of the PCB by using a 2-dimensional, 2,5-dimensional or 3-dimensional technique.

9. The method of claim 8,
   wherein in the visualizing step the superimposed measured values of the electromagnetic parameter are overlaid with false color on the map representation of the PCB, the map representation of the PCB is false color coded based on the superimposed measured values of the electromagnetic parameter to visualize them, or bar graphs are used to visualize the superimposed measured values of the electromagnetic parameter on the map representation of the PCB.

10. A system for visualizing measured values of an electromagnetic parameter of a printed circuit board, PCB, comprising:

a probe with a probe head configured to contactless measure values of at least one electromagnetic parameter at at least two different positions of the PCB;

a camera fixed in position relative to the probe head and configured to record for each of the different positions an image of an area of the PCB around the probe head;

a processing device configured to correlate, for each of the different positions, the measured values of the electromagnetic parameter with the recorded image of the area of the PCB around the probe head, determine a location of each of the recorded images of the areas on an map representation of the PCB, and superimpose the map representation of the PCB with the measured values of the electromagnetic parameter; and a visualization device configured to visualize the map representation of the PCB together with the superimposed measured values of the electromagnetic parameter.

11. The system of claim 10, wherein the camera is arranged in the probe, in particular in the probe head, or close to the probe.

12. The system of claim 10, wherein system further comprises a oscilloscope, spectrum analyzer, signal analyzer or EMI test receiver, wherein the processing device and the visualization device are arranged in the oscilloscope, spectrum analyzer, signal analyzer or EMI test receiver and the probe and the camera are connected with the oscilloscope, spectrum analyzer, signal analyzer or EMI test receiver.

13. The system of claim 10, wherein the probe comprises a button or micro button for triggering the camera to record the images of the areas.

14. A probe for measuring values of an electromagnetic parameter of a printed circuit board, PCB, comprising:

a probe head configured to contactless measure values of at least one electromagnetic parameter at at least two different positions of the PCB;

a camera configured to record for each of the different positions an image of an area of the PCB around the probe head;

a processing unit configured to:

correlate, for each of the different positions, the measured values of the electromagnetic parameter with the recorded image of the area of the PCB around the probe head, determine a location of each of the recorded images of the areas on an map representation of the PCB, and superimpose the map representation of the PCB with the measured values of the electromagnetic parameter; and a transmission unit configured to transmit the map representation of the PCB together with the superimposed measured values of the electromagnetic parameter to a visualization device.

15. The probe of claim 14, wherein the transmission unit is configured to transmit the map representation of the PCB together with the superimposed measured values of the electromagnetic parameter to an oscilloscope, spectrum analyzer, signal analyzer or EMI test receiver.

* * * * *